(12) United States Patent
Koo

(10) Patent No.: US 9,882,131 B2
(45) Date of Patent: Jan. 30, 2018

(54) ORGANIC LIGHT EMITTING DIODE DISPLAY

(71) Applicant: SAMSUNG DISPLAY CO., LTD., Yongin-si, Gyeonggi-do (KR)

(72) Inventor: Yong-Kyoung Koo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/055,437

(22) Filed: Feb. 26, 2016

(65) Prior Publication Data

US 2016/0254453 A1 Sep. 1, 2016

(30) Foreign Application Priority Data

Feb. 26, 2015 (KR) ........................ 10-2015-0027322

(51) Int. Cl.
*H01L 51/00* (2006.01)
*H01L 51/56* (2006.01)
*H01L 27/32* (2006.01)
*H01L 51/52* (2006.01)

(52) U.S. Cl.
CPC ...... *H01L 51/0021* (2013.01); *H01L 27/3246* (2013.01); *H01L 51/56* (2013.01); *H01L 51/5221* (2013.01)

(58) Field of Classification Search
CPC .. H01L 27/3246; H01L 51/0021; H01L 51/56
See application file for complete search history.

(56) References Cited

U.S. PATENT DOCUMENTS

| 8,368,056 B2* | 2/2013 | Lee | H01L 51/525 257/40 |
| 2011/0006336 A1* | 1/2011 | Lee | H01L 27/3246 257/99 |
| 2011/0084287 A1* | 4/2011 | Lee | H01L 51/525 257/88 |
| 2011/0221334 A1* | 9/2011 | Kwon | H01L 27/3246 313/504 |

FOREIGN PATENT DOCUMENTS

| KR | 2010130303 A | * 12/2010 |
| KR | 10-1107158 B1 | 1/2012 |
| KR | 10-2013-0073014 A | 7/2013 |
| KR | 10-2014-0050933 A | 4/2014 |
| KR | 10-2014-0061123 A | 5/2014 |
| KR | 10-2014-0067326 A | 6/2014 |
| KR | 10-2014-0088739 A | 7/2014 |

* cited by examiner

*Primary Examiner* — Allan R Wilson
(74) *Attorney, Agent, or Firm* — Lewis Roca Rothgerber Christie LLP

(57) ABSTRACT

An organic light emitting diode display including: a plurality of pixel electrodes formed in a display area of a substrate; a pixel defining layer having an opening exposing a part of each of the plurality of pixel electrodes and formed in the display area; a plurality of emission layers formed on the plurality of pixel electrodes; and a common electrode formed on the pixel defining layer and the plurality of emission layers. The pixel defining layer is formed with a smaller thickness farther from the center of the display area.

8 Claims, 10 Drawing Sheets

ORGANIC LIGHT EMITTING DIODE DISPLAY

CROSS-REFERENCE TO RELATED APPLICATION

This application claims priority to and the benefit of Korean Patent Application No. 10-2015-0027322, filed in the Korean Intellectual Property Office on Feb. 26, 2015, the entire content of which is incorporated herein by reference.

BACKGROUND

1. Field

The described technology relates generally to an organic light emitting diode display, and more particularly, to an organic light emitting diode display for enhancing film quality of a common electrode.

2. Description of the Related Art

An organic light emitting diode display includes an organic light emitting diode configured by an emission layer, an anode injecting holes to the emission layer, and a cathode injecting electrons to the emission layer. The electrons and the holes are coupled with each other in the emission layer to generate excitons, and light is emitted by energy generated when the excitons fall from an excited state to a ground state.

Any one of the anode and the cathode can be a pixel electrode, and the other one becomes a common electrode. The pixel electrode is formed one by one for each pixel, while the common electrode is formed over the entire display area. An emission layer and a pixel defining layer (or a partition wall), defining an area in which the emission layer is to be formed, are formed between the pixel electrode and the common electrode.

The common electrode may be formed by a spin deposition method. The spin deposition method is a method of disposing a deposition source below the center of the substrate and depositing the common electrode while rotating the substrate. However, as the substrate is enlarged, the deposition of the common electrode is not performed well due to the thickness of the pixel defining layer outside the substrate.

Accordingly, a part of the common electrode is thinly formed or may include a non-deposition area. In this case, a filler between the substrate and an encapsulation substrate or outgas of the filler flows into the emission layer through the non-deposition area to damage the emission layer. Since the damage region of the emission layer is widely enlarged over time, display quality and reliability of products deteriorate.

The above information disclosed in this Background section is only for enhancement of understanding of the background of the described technology and therefore it may contain information that does not form the prior art that is already known in this country to a person of ordinary skill in the art.

SUMMARY

Aspects of embodiments of the described technology are directed toward an organic light emitting diode display capable of preventing (or protecting from) deterioration of an emission characteristic of an emission layer and/or of enhancing display quality and reliability of products by preventing (or protecting) a non-deposition area from being generated in a common electrode when the common electrode is formed by a spin deposition method (spin deposition).

An exemplary embodiment provides an organic light emitting diode display including: a plurality of pixel electrodes formed in a display area of a substrate; a pixel defining layer having an opening exposing a part of each of the plurality of pixel electrodes and formed in the display area; a plurality of emission layers formed on the plurality of pixel electrodes; and a common electrode formed on the pixel defining layer and the plurality of emission layers. The pixel defining layer may be formed with a smaller thickness in a peripheral portion of the display area than in a center of the display area.

The thickness of the pixel defining layer may be gradually decreased farther from the center of the display area. The display area may include a central area and at least two peripheral areas positioned outside the central area, and the thickness of the pixel defining layer may be different for each area. First and second peripheral areas of the at least two peripheral areas may respectively have different distances from the central area.

In the peripheral portion of the display area, the pixel defining layer may have different thicknesses at one side and another side of the pixel electrode. One side and the other side of the pixel electrode may be a side facing the center of the display area and an opposite side thereof, respectively. The thickness of the pixel defining layer contacting one side of the pixel electrode may be smaller than the thickness of the pixel defining layer contacting the other side of the pixel electrode.

The common electrode may be formed by spin deposition. In the peripheral portion of the display area, a side slope of the pixel defining layer may be equal to or smaller than a slope of a progress direction of metal particles during the deposition.

According to the exemplary embodiment, it is possible to reduce manufacturing costs by forming the common electrode by spin deposition and improve film quality of the common electrode by preventing an abnormal area (a portion which is less deposited or not deposited) from being generated in the common electrode. Therefore, it is possible to improve display quality and reliability of products by preventing damage to the emission layer due to the filler.

DETAILED DESCRIPTION

Figure 1:
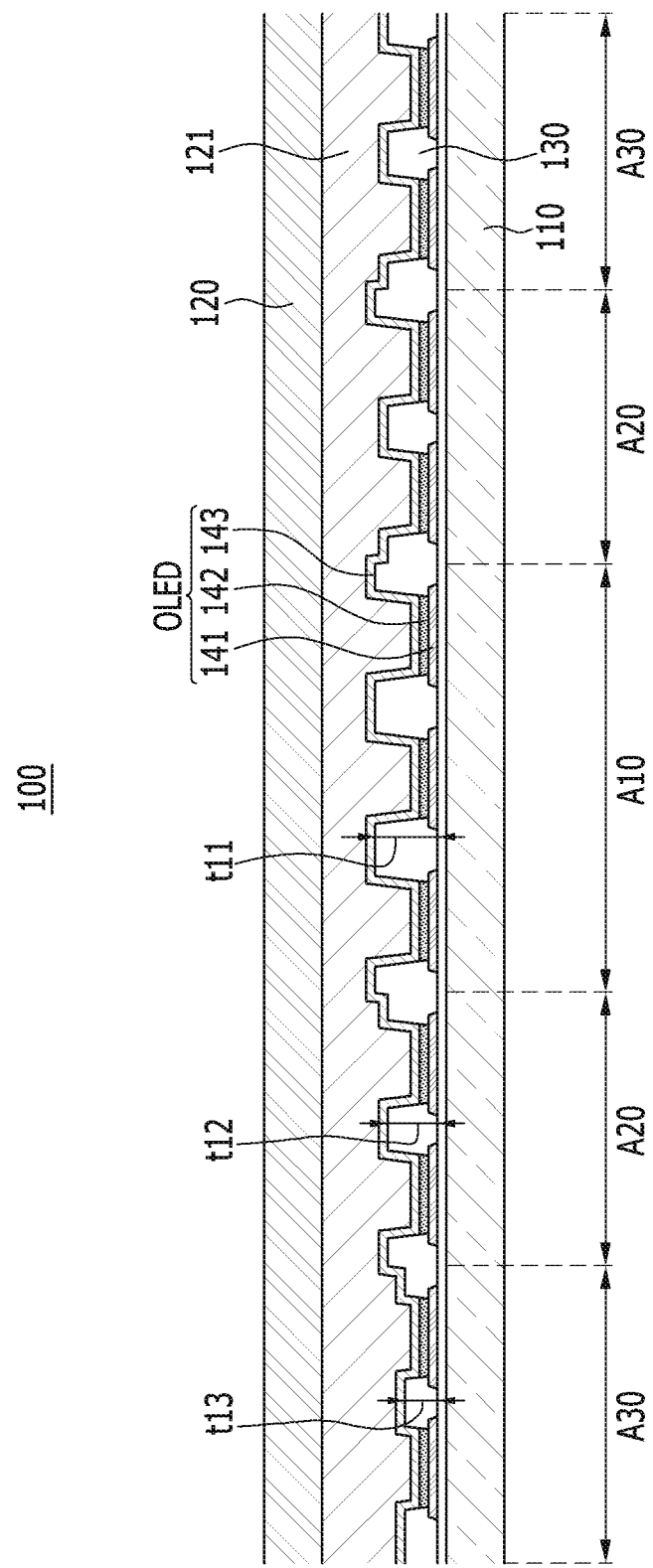
FIG. 1 is a schematic cross-sectional view of an organic light emitting diode display according to a first exemplary embodiment.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

It will be understood that when an element such as a layer, film, region, or substrate is referred to as being "on" another element, it can be directly on the other element or intervening elements may also be present. Further, in the specification, the word "on" refers to positioning on or below the object portion, and does not essentially mean positioning on the upper side of the object portion based on a gravity direction.

In addition, unless explicitly described to the contrary, the word "comprise" and variations such as "comprises" or "comprising", will be understood to refer to the inclusion of stated elements but not the exclusion of any other elements. In addition, the size and thickness of each configuration shown in the drawings are arbitrarily shown for understanding and ease of description, but the present disclosure is not limited thereto.

Figure 2:
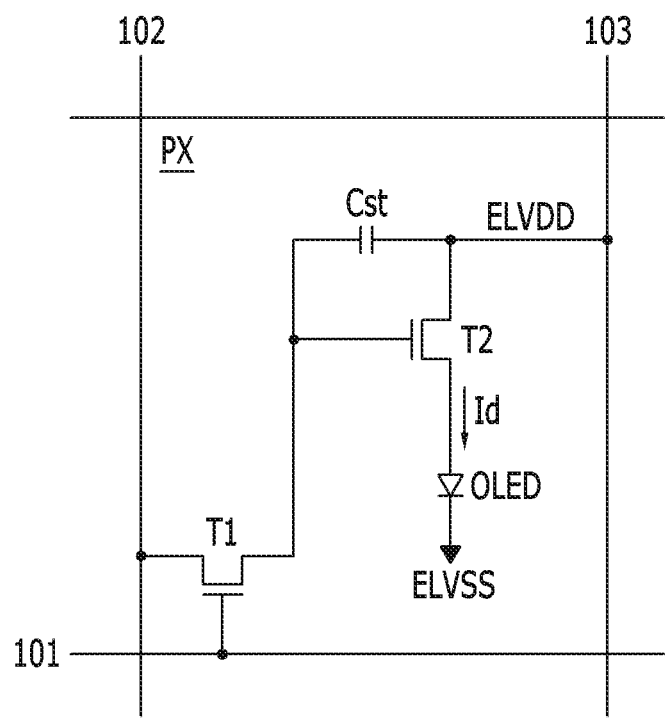
FIG. 2 is an equivalent circuit diagram of one pixel of the organic light emitting diode display illustrated in FIG. 1.
Figure 3:
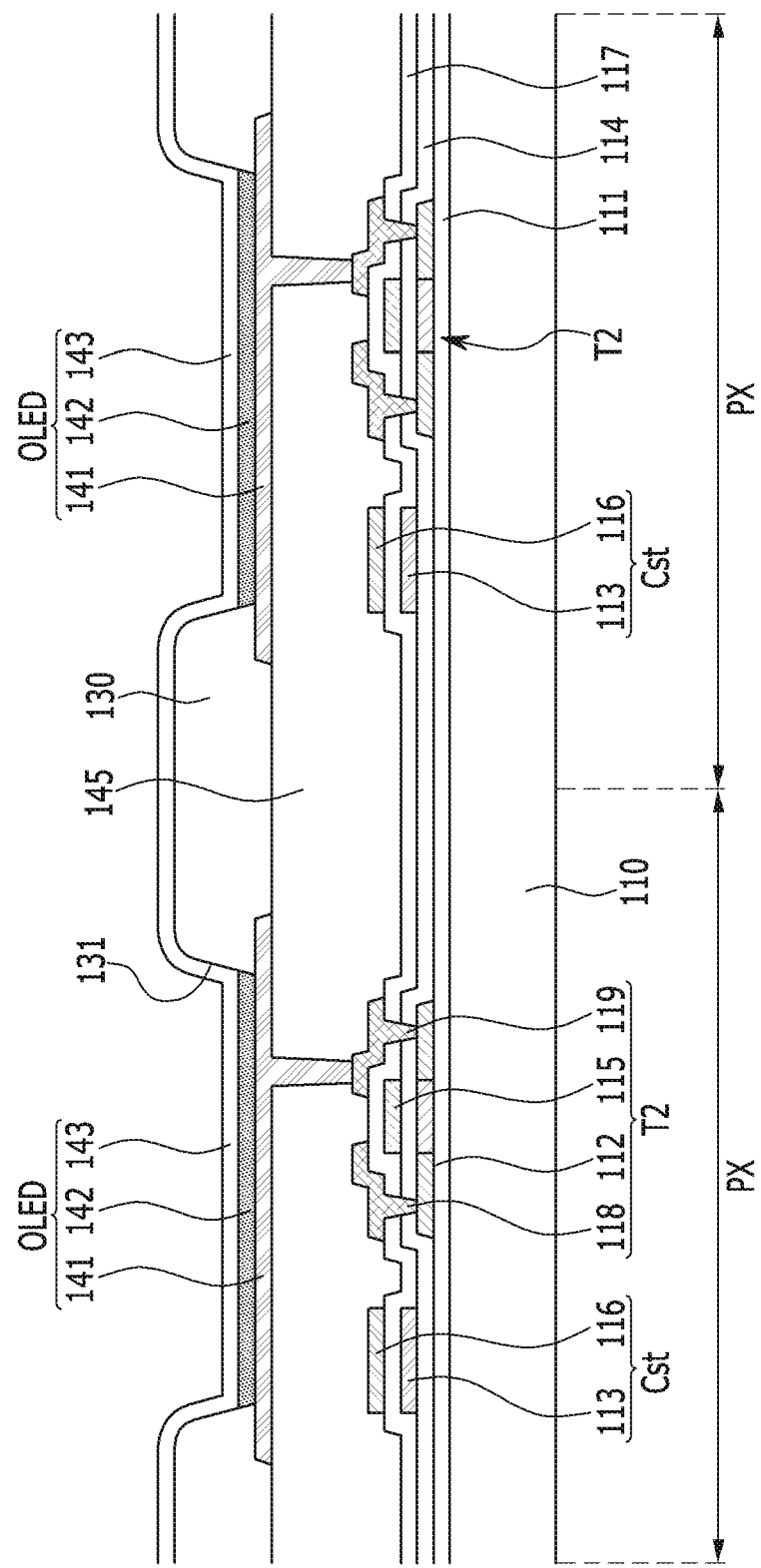
FIG. 3 is a partial enlarged view of the organic light emitting diode display illustrated in FIG. 1.

FIG. 1 is a schematic cross-sectional view of an organic light emitting diode display according to a first exemplary embodiment, FIG. 2 is an equivalent circuit diagram of one pixel of the organic light emitting diode display illustrated in FIG. 1, and FIG. 3 is a partial enlarged view of FIG. 1.

Referring to FIGS. 1 to 3, an organic light emitting diode display 100 includes a substrate 110, a plurality of pixels PX formed on the substrate 110, and an encapsulation substrate 120 attached to the substrate 110 and encapsulating the plurality of pixels PX. Further, a pixel defining layer 130 (alternatively, a partition wall) is formed on the substrate 110 to define an emission area of the pixels PX.

In a display area of the substrate 110, a plurality of signal lines 101, 102, and 103, and a plurality of pixels PX connected to the plurality of signal lines 101, 102, and 103 and arranged substantially in a matrix configuration is formed. The plurality of signal lines includes a scan line 101 transferring a scan signal, a data line 102 transferring a data signal, and a driving voltage line 103 transferring a driving voltage ELVDD.

The scan line 101 is substantially formed to extend in parallel with a row direction, and the data line 102 and the driving voltage line 103 are substantially formed to extend in parallel with a column direction. Each pixel PX includes a switching thin film transistor T1, a driving thin film transistor T2, a storage capacitor Cst, and an organic light emitting diode OLED.

The switching thin film transistor T1 includes a control terminal, an input terminal, and an output terminal. The control terminal is connected to the scan line 101, the input terminal is connected to the data line 102, and the output terminal is connected to the driving thin film transistor T2. The switching thin film transistor T1 transfers the data signal applied to the data line 102 to the driving thin film transistor T2 in response to the scan signal applied to the scan line 101.

The driving thin film transistor T2 includes a control terminal, an input terminal, and an output terminal. The control terminal is connected to the switching thin film transistor T1, the input terminal is connected to the driving voltage line 103, and the output terminal is connected to the organic light emitting diode OLED. The driving thin film transistor T2 provides an output current Id of which an amplitude varies according to a voltage applied between the control terminal and the output terminal.

The storage capacitor Cst is connected to the control terminal and the input terminal of the driving thin film transistor T2 between the control terminal and the input terminal of the driving thin film transistor T2. The storage capacitor Cst is charged with the data signal applied to the control terminal of the driving thin film transistor T2 and maintains the charged data signal even after the switching thin film transistor T1 is turned off.

The organic light emitting diode OLED includes a pixel electrode 141 connected to the output terminal of the driving thin film transistor T2, a common electrode 143 connected to a common voltage ELVSS, and an emission layer 142 positioned between the pixel electrode 141 and the common electrode 143. The organic light emitting diode OLED emits light by varying an intensity according to the output current of the driving thin film transistor T2.

The pixel configuration of the organic light emitting diode display is not limited to the aforementioned example, and if necessary, a separate thin film transistor and a separate capacitor may be added. Hereinafter, a cross-sectional structure of the pixels will be described in more detail.

A buffer layer 111 is formed on the substrate 110. The substrate 110 may be an insulation substrate (such as glass, quartz, ceramic, and/or plastic) and/or a metal substrate (such as stainless steel). The buffer layer 111 may be formed by a single layer of silicon nitride (SiNx) or a double layer of silicon nitride (SiNx) and silicon oxide ($SiO_2$). The buffer layer 111 serves to prevent impurities from permeating through the substrate 110 and planarize the surface.

A semiconductor layer 112 is formed on the buffer layer 111. The semiconductor layer 112 may be formed of polysilicon or an oxide semiconductor, and the semiconductor layer 112 formed of the oxide semiconductor may be covered by a separate passivation layer. The semiconductor layer 112 includes a channel region in which impurities are not doped, and a source region and a drain region in which the impurities are doped.

A gate insulating layer 114 is formed on the semiconductor layer 112. The gate insulating layer 114 may be formed of a single layer of silicon nitride (SiNx) or silicon oxide ($SiO_2$) or a laminated layer of silicon nitride (SiNx) and silicon oxide ($SiO_2$). A gate electrode 115 and a first storage capacitor plate 113 are formed on the gate insulating layer 114. The gate electrode 115 overlaps with the channel region of the semiconductor layer 112 and may include Au, Ag, Cu, Ni, Pt, Pd, Al, Mo, and/or the like.

An interlayer insulating layer 117 is formed on the gate electrode 115 and the first storage capacitor plate 113. The interlayer insulating layer 117 may be formed of a single layer of silicon nitride (SiNx) or silicon oxide ($SiO_2$) or a laminated layer of silicon nitride (SiNx) and silicon oxide ($SiO_2$).

A source electrode 118, a drain electrode 119, and a second storage capacitor plate 116 are formed on the interlayer insulating layer 117. The source electrode 118 and the drain electrode 119 are connected with the source region and the drain region of the semiconductor layer 112 through a via opening (e.g., a via hole) formed in the interlayer insulating layer 117 and the gate insulating layer 114, respectively. The source electrode 118 and the drain electrode 119 may be formed by a metal multilayer such as Mo/Al/Mo and/or Ti/Al/Ti.

The second storage capacitor plate 116 overlaps with the first storage capacitor plate 113. Accordingly, the first and second storage capacitor plates 113 and 116 form the storage capacitor Cst which uses the interlayer insulating layer 117 as a dielectric material.

In FIG. 3, a top gate type (kind) driving thin film transistor T2 is illustrated as an example, but a structure of the driving thin film transistor T2 is not limited to the illustrated example. The driving thin film transistor T2 is covered by a planarization layer 145 and connected to the organic light emitting diode OLED to drive the organic light emitting diode OLED.

The planarization layer 145 may be formed of a single layer of an inorganic insulating material or an organic insulating material or a laminated layer of the inorganic insulating material and the organic insulating material. The inorganic insulating material may include $SiO_2$, SiNx, $Al_2O_3$, $TiO_2$, $ZrO_2$, or the like, and the organic insulating material may include an acryl-based polymer, an imide-based polymer, polystyrene, or the like.

The pixel electrode 141 is formed on the planarization layer 145. The pixel electrode 141 is formed one by one for each pixel and connected with the drain electrode 119 of the driving thin film transistor T2 through the via hole formed in the planarization layer 145. The pixel defining layer 130 is formed on the planarization layer 145 and an edge of the pixel electrode 141. The pixel defining layer 130 may include a polyacrylate or polyimide-based resin, a silica-based inorganic material, and/or the like.

The emission layer 142 is formed on the pixel electrode 141, and the common electrode 143 is formed on the emission layer 142 and the pixel defining layer 130. The common electrode 143 is formed in the entire display area without distinction for each pixel. Any one of the pixel electrode 141 and the common electrode 143 injects holes to the emission layer 142, and the other one injects electrons to the emission layer 142.

The emission layer 142 includes an organic emission layer, and includes at least one of a hole injection layer, a hole transport layer, an electron transport layer, and an electron injection layer. When the pixel electrode 141 is an anode injecting hole, the hole injection layer, the hole transport layer, the organic emission layer, the electron transport layer, and the electron injection layer may be sequentially laminated on the pixel electrode 141. In this case, other layers except for the organic emission layer may be formed in the entire display area.

In the case where the organic light emitting diode display 100 is a top emission type (kind), the pixel electrode 141 is formed by a reflective film, and the common electrode 143 is formed by a transparent film or a translucent film. The light emitted from the emission layer 142 is reflected from the pixel electrode 141 and passes through the common electrode 143 to be emitted to the outside. On the other hand, in the case where the organic light emitting diode display 100 is a bottom emission type (kind), the pixel electrode 141 is formed by a transparent film or a translucent film, and the common electrode 143 is formed by a reflective film.

The reflective film may include Au, Ag, Mg, Al, Pt, Pd, Ni, Nd, Ir, Cr, and/or the like. The transparent film may include indium tin oxide (ITO), indium zinc oxide (IZO), ZnO, $In_2O_3$, and/or the like. The translucent film may be formed by a metal thin film including Li, Ca, LiF/Ca, LiF/Al, Al, Ag, Mg, and/or the like, and a transparent film such as ITO, IZO, ZnO, $In_2O_3$, and/or the like may be formed on the translucent film.

The encapsulation substrate 120 is attached to the substrate 110 by a sealant and encapsulates the plurality of pixels PX. Since the organic light emitting diode OLED is very vulnerable to moisture and oxygen, the sealant and the encapsulation substrate 120 blocks external air from permeating to prevent (or protect from) deterioration of the organic light emitting diode OLED. A filler 121 such as a moisture absorbent may be filled between the substrate 110 and the encapsulation substrate 120.

The pixel defining layer 130 defines an area (emission area) in which the emission layer 142 is to be positioned by forming an opening 131 exposing the center of the pixel electrode 141. Generally, the thickness of the pixel defining layer 130 is 20 times or more of the thickness of the emission layer 142. The common electrode 143 is formed on all of the exposed side(s) (including, e.g., the lateral and upper sides) of the pixel defining layer 130 and formed to be curved along a surface shape of the pixel defining layer 130.

The pixel defining layer 130 (i.e., the entire patterned pixel defining layer 130) is formed with the largest thickness at the center of the display area and formed with a smaller thickness farther from the center of the display area. The thickness of the pixel defining layer 130 may be gradually decreased farther from the center of the display area. On the other hand, the display area may include a central area, and at least two peripheral areas positioned at the outside of the central area, and the thicknesses of the pixel defining layer 130 may be varied for each area.

For example, the display area may include a central area A10, a first peripheral area A20 positioned outside the central area A10, and a second peripheral area A30 positioned outside the first peripheral area A20. The pixel defining layer 130 is formed with a thickness of t11 in the central area A10, with a thickness of t12 smaller than t11 in the first peripheral area A20, and with a thickness of t13 smaller than t12 in the second peripheral area A30.

In FIG. 1, for convenience, a case where the display area is divided into the three areas A10, A20, and A30 is illustrated as an example, and the number of divided areas is not limited to the illustrated example.

Figure 4:
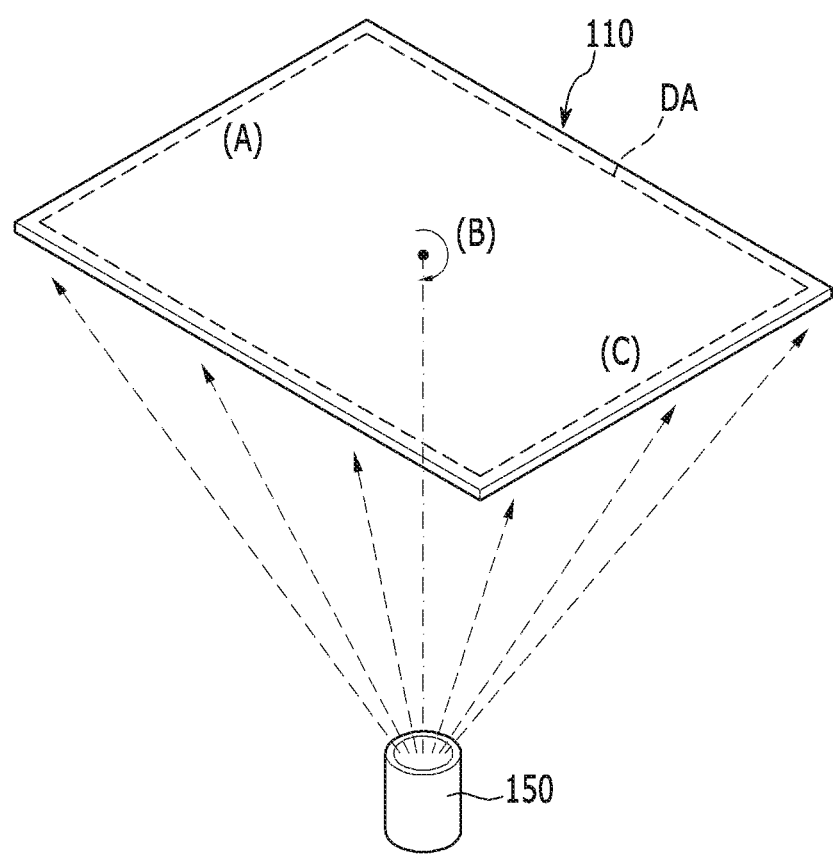
FIG. 4 is a schematic diagram for describing a spin deposition method.

The common electrode 143 may be formed by a spin deposition method (spin deposition) that rotates the substrate 110. FIG. 4 is a schematic diagram for describing a spin deposition method.

Referring to FIGS. 1 and 4, the substrate 110 is disposed on a deposition source 150 including a crucible, a heating wire, and/or the like. The pixel defining layer 130 and the emission layer 142 are formed on a lower surface of the substrate 110 facing the deposition source 150, and the deposition source 150 faces the center of the display area DA.

While the position of the deposition source 150 is fixed, the substrate 110 is rotated by setting the center of the display area DA as a rotation center. Then, the common electrode 143 is formed on the pixel defining layer 130 and the emission layer 142. In the spin deposition method (spin deposition), it is desired to shorten the deposition time to reduce manufacturing cost.

In the organic light emitting diode display 100 of the present embodiment, the pixel defining layer 130 is thinly formed farther from the center of the display area DA to prevent (or protect from) a non-deposition area from being generated in a process of spin-depositing the common electrode 143.

Figure 5:
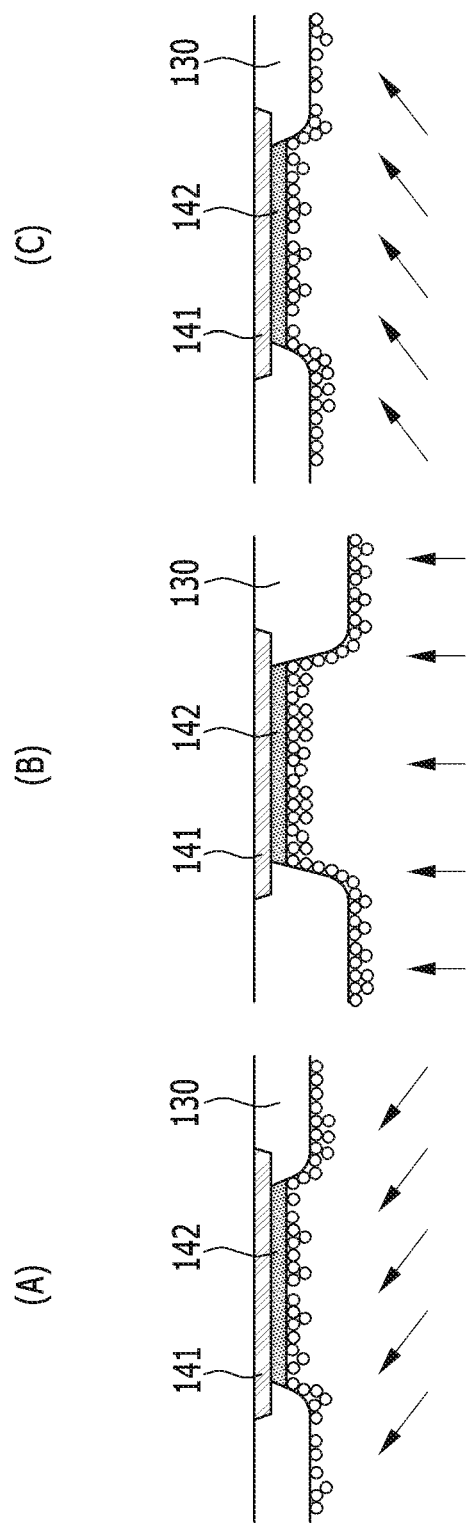
FIG. 5 is an enlarged cross-sectional view illustrating parts of a region A, a region B, and a region C of the substrate illustrated in FIG. 4.

FIG. 5 is an enlarged cross-sectional view illustrating parts of a region A, a region B, and a region C of the substrate illustrated in FIG. 4. In FIG. 5, the region B corresponds to the center of the display area DA, and the region A and the region C correspond to peripheral portions of the display area DA.

Referring to FIGS. 4 and 5, metal particles emitted from the deposition source 150 are radially dispersed, in the region B, the metal particles vertically ascend to be deposited on the pixel defining layer 130 and the emission layer 142, and in the region A and the region C, the metal particles proceed in an oblique direction to be deposited on the pixel defining layer 130 and the emission layer 142.

The pixel defining layer 130 in the region A and the region C is formed with thicknesses which are smaller than the thickness of the pixel defining layer 130 in the region B, and thus the progress path of the metal particles is not blocked by the pixel defining layer 130. That is, the pixel defining layer 130 in the region A and the region C does not act as an impediment that impedes the deposition of the metal particles.

Accordingly, the common electrode 143 may be evenly deposited on the upper surface and the side of the pixel defining layer 130 without the non-deposition area. In this case, the pixel defining layer 130 may be formed so as to have a side slope which is equal to or smaller than a slope of the progress direction of the metal particles.

Figure 6:
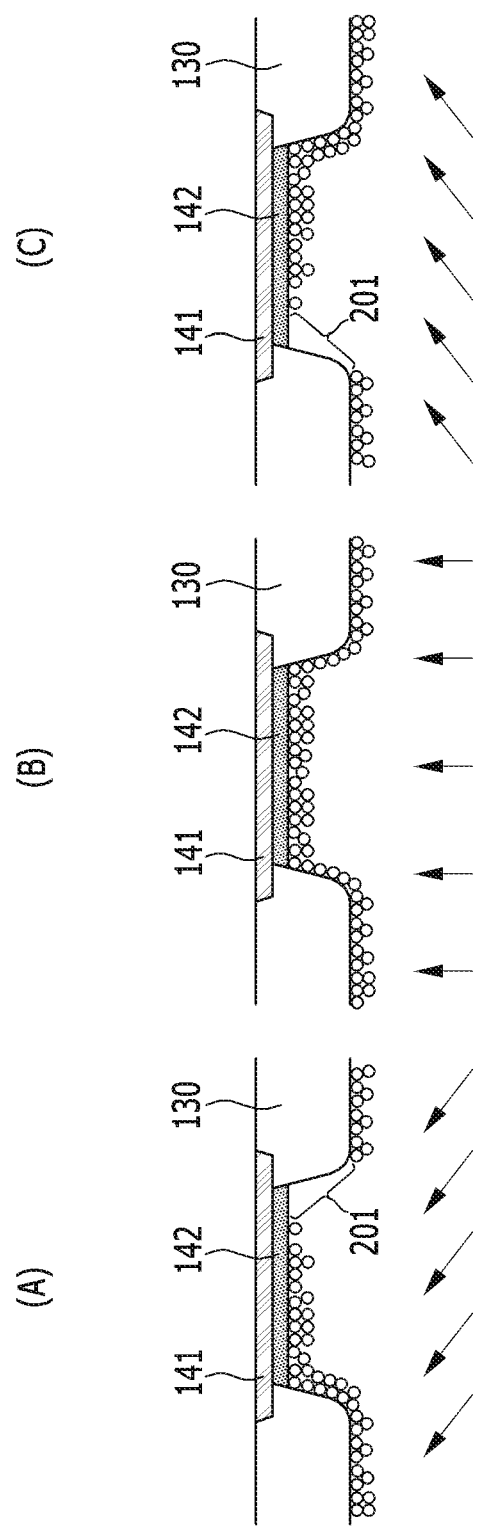
FIG. 6 is an enlarged cross-sectional view illustrating pixels of a region A, a region B, and a region C in an organic light emitting diode display of a Comparative Example.

FIG. 6 is an enlarged cross-sectional view illustrating pixels of a region A, a region B, and a region C in an organic light emitting diode display of a Comparative Example. In an organic light emitting diode display according to a Comparative Example, the thicknesses of the pixel defining layer in the region A and the region C are the same as the thickness of the pixel defining layer in the region B.

Referring to FIG. 6, in the region A and the region C, the progress direction of the metal particles may be blocked by the pixel defining layer 130, and there may be an abnormal area 201 in which the metal particles are less deposited or not completely deposited on the emission layer 142.

In the abnormal area 201, the filler 121 directly contacts the emission layer 142 or outgas of the filler 121 easily flows into the emission layer 142 to damage the emission layer 142. The damaged portion of the emission layer 142 becomes a non-emission area, and the non-emission area is enlarged over time to deteriorate display quality.

However, in the organic light emitting diode display 100 of the exemplary embodiment, since the pixel defining layer 130 does not act as a deposition impediment, the abnormal area is not generated in the common electrode 143. Accordingly, the filler 121 does not contact the emission layer 142, and the outgas of the filler 121 does not also flow into the emission layer 142. The organic light emitting diode display 100 of the exemplary embodiment may prevent damage to the emission layer 142 by enhancing film quality of the common electrode 143.

Figure 7:
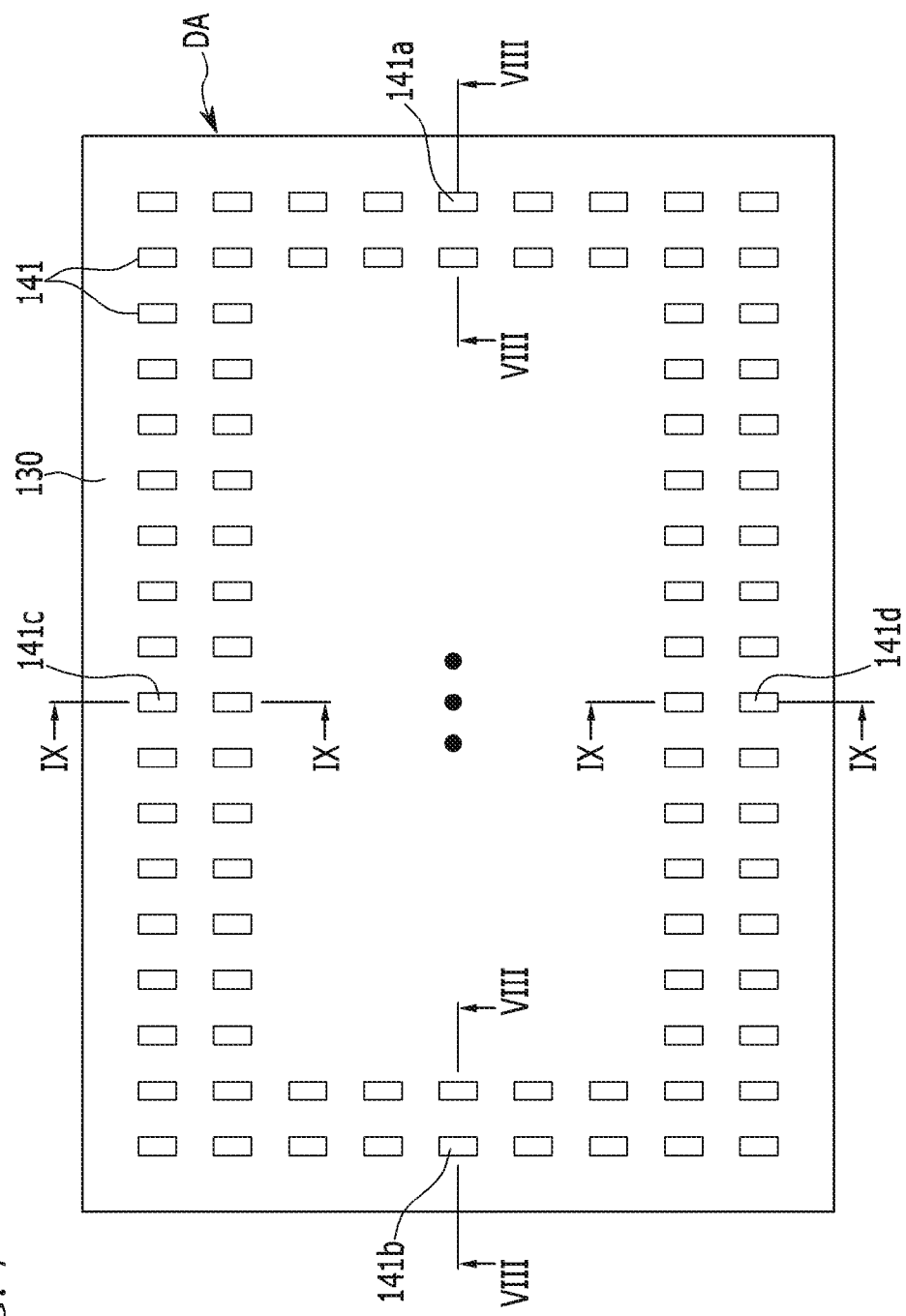
FIG. 7 is a schematic plan view of a display area of an organic light emitting diode display according to a second exemplary embodiment.
Figure 8:
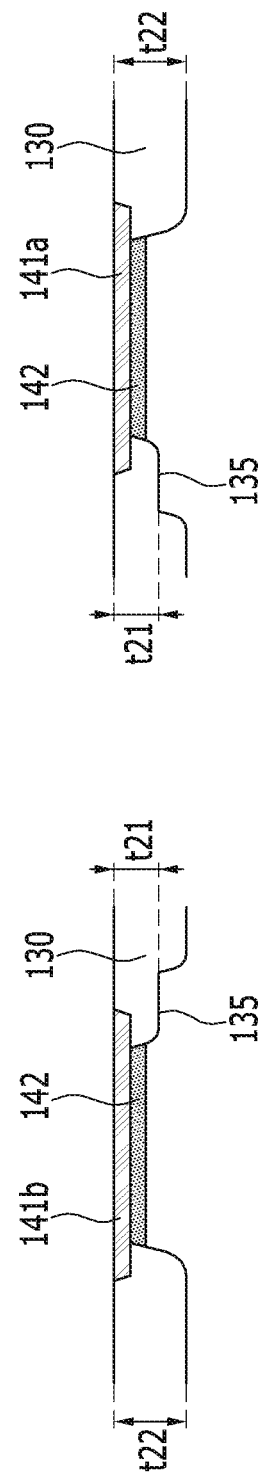
FIG. 8 is a cross-sectional view taken along a line VIII-VIII illustrated in FIG. 7.
Figure 9:
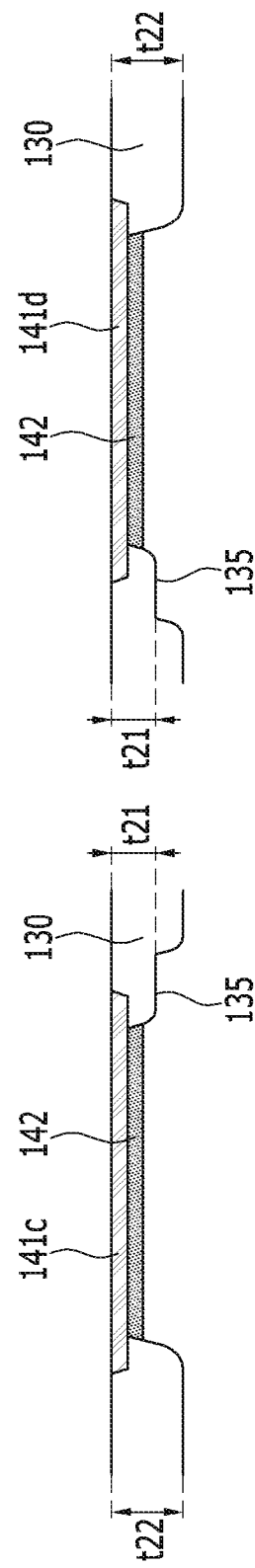
FIG. 9 is a cross-sectional view taken along a line IX-IX illustrated in FIG. 7.

FIG. 7 is a schematic plan view of a display area of an organic light emitting diode display according to a second exemplary embodiment, FIG. 8 is a cross-sectional view taken along a line VIII-VIII illustrated in FIG. 7, and FIG. 9 is a cross-sectional view taken along a line IX-IX illustrated in FIG. 7.

Referring to FIGS. 7 to 9, the organic light emitting diode display according to the second exemplary embodiment is formed by the same configuration as the aforementioned first exemplary embodiment, except that parts of the pixel defining layer 130 are formed with different thicknesses at one side and the other side of the pixel electrode 141. The same members as those of the first exemplary embodiment use the same reference numerals, and hereinafter, different configurations from the first exemplary embodiment will be described.

A part of the pixel defining layer 130 formed in the peripheral area of the display area DA in the pixel defining layer 130 formed in the entire display area DA has different thicknesses at one side and the other side of the pixel electrode 141. In this case, one side of the pixel electrode 141 is a side facing the center of the display area DA, and the other side is defined as an opposite side thereof (i.e., as the side facing oppositely away from the center).

Based on FIG. 7, a pixel electrode 141a positioned at a right center of the display area DA includes a left side facing the center of the display area DA and a right side being the opposite side thereof. A pixel electrode 141b positioned at a left center of the display area DA includes a right side facing the center of the display area DA and a left side being the opposite side thereof.

Similarly, a pixel electrode 141c positioned at an upper center of the display area DA includes a lower side facing the center of the display area DA and an upper side being the opposite side thereof. A pixel electrode 141d positioned at a lower center of the display area DA includes an upper side facing the center of the display area DA and a lower side being the opposite side thereof.

Figure 10:
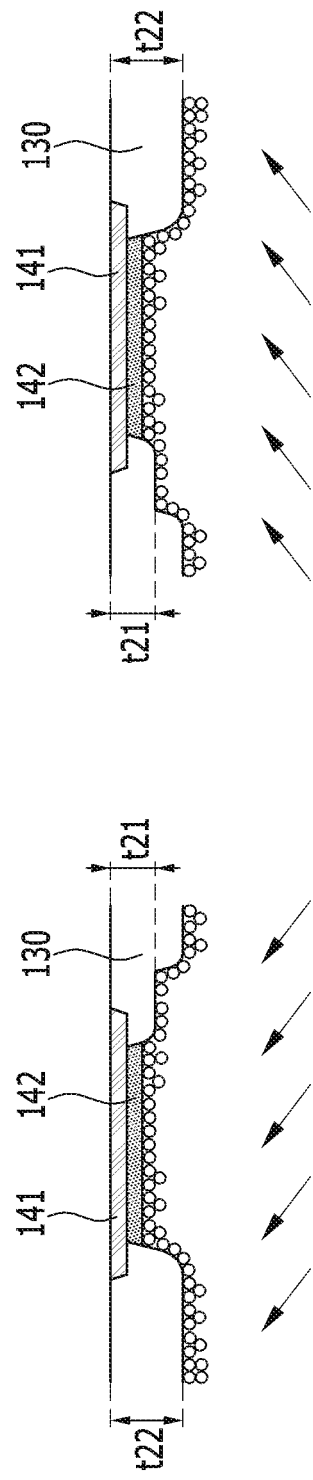
FIG. 10 is a cross-sectional view illustrating a progress direction of deposition particles added to FIG. 8.

The thickness of the pixel defining layer 130 contacting one side of the pixel electrode 141 is smaller than the thickness of the pixel defining layer contacting the other side of the pixel electrode 141 (t21<t22). To this end, a concave groove 135 is formed on the pixel defining layer 130 contacting one side of the pixel electrode 141. FIG. 10 is a cross-sectional view illustrating a progress direction of deposition particles added to FIG. 8.

Referring to FIG. 10, the pixel defining layer 130 is formed with a smaller thickness at one side of the pixel electrode 141 close to the deposition source 150 than the other side of the pixel electrode 141. Accordingly, when the metal particles are scattered and deposited in an oblique direction, there is no portion impeding the deposition of the metal particles, and the common electrode 143 may be evenly deposited on the upper surface and the side of the pixel defining layer 130 without the non-deposition area.

As such, in the organic light emitting diode displays of the first and second exemplary embodiments, the common electrode 143 is formed by the spin deposition method to reduce manufacturing cost, and the abnormal area (the portion which is less deposited or not deposited) is not generated in the common electrode 143 to improve film quality of the common electrode 143. As a result, display quality and reliability of products may be improved by preventing damage to the emission layer 142 due to the filler 121.

The use of "may" when describing embodiments of the present invention refers to "one or more embodiments of the present invention."

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise.

As used herein, the term "and/or" includes any and all combinations of one or more of the associated listed items. Further, the use of "may" when describing embodiments of the inventive concept refers to "one or more embodiments of the inventive concept." Also, the term "exemplary" is intended to refer to an example or illustration.

As used herein, the terms "use," "using," and "used" may be considered synonymous with the terms "utilize," "utilizing," and "utilized," respectively.

The display and/or any other relevant devices or components according to embodiments of the present invention described herein may be implemented utilizing any suitable hardware, firmware (e.g. an application-specific integrated circuit), software, or a combination of software, firmware, and hardware. For example, the various components of the display may be formed on one integrated circuit (IC) chip or on separate IC chips. Further, the various components of the display may be implemented on a flexible printed circuit film, a tape carrier package (TCP), a printed circuit board (PCB), or formed on one substrate. Further, the various components of the display maybe may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting diode display, comprising:
a plurality of pixel electrodes in a display area of a substrate;
a pixel defining layer having an opening exposing a part of each of the plurality of pixel electrodes and in the display area;
a plurality of emission layers on the plurality of pixel electrodes; and
a common electrode on the pixel defining layer and the plurality of emission layers,
wherein the pixel defining layer has a smaller thickness in a peripheral portion of the display area than in a center of the display area, and
wherein the thickness of the pixel defining layer is gradually decreased farther from the center of the display area.

2. The organic light emitting diode display of claim 1, wherein:
the display area comprises a central area and at least two peripheral areas positioned outside the central area, and
the thickness of the pixel defining layer is different for each area.

3. The organic light emitting diode display of claim 2, wherein:
first and second peripheral areas of the at least two peripheral areas respectively have different distances from the central area.

4. The organic light emitting diode display of claim 1, wherein:
the common electrode is formed by spin deposition.

5. The organic light emitting diode display of claim 4, wherein:
in the peripheral portion of the display area, a side slope of the pixel defining layer is equal to or smaller than a slope of a progress direction of metal particles during the deposition.

6. A method of forming an organic light emitting diode display, the method comprising:
forming a plurality of pixel electrodes in a display area of a substrate;
forming in the display area, a pixel defining layer having an opening exposing a part of each of the plurality of pixel electrodes;
forming a plurality of emission layers on the plurality of pixel electrodes; and
forming a common electrode on the pixel defining layer and the plurality of emission layers,
wherein the pixel defining layer is formed with a smaller thickness in a peripheral portion of the display area than in a center of the display area, and
wherein the thickness of the pixel defining layer is gradually decreased farther from the center of the display area.

7. The method of claim 6, wherein:
the common electrode is formed by spin deposition.

8. The method of claim 7, wherein:
in the peripheral portion of the display area, a side slope of the pixel defining layer is equal to or smaller than a slope of a progress direction of metal particles during the deposition.

* * * * *